United States Patent [19]

Inoue et al.

[11] Patent Number: 5,422,532
[45] Date of Patent: Jun. 6, 1995

[54] PIEZOELECTRIC RESONANCE COMPONENT

[75] Inventors: Jiro Inoue; Hiroaki Kaida, both of Nagaokakyo, Japan

[73] Assignee: Murata Manufacturing Co., Ltd., Kyoto, Japan

[21] Appl. No.: 191,266

[22] Filed: Feb. 3, 1994

[30] Foreign Application Priority Data

Feb. 9, 1993 [JP] Japan .................................. 5-021044

[51] Int. Cl.$^6$ ............................................ H01L 41/08
[52] U.S. Cl. .................................. 310/326; 310/312; 310/333; 310/367
[58] Field of Search ............... 310/312, 320, 326, 367, 310/333

[56] References Cited

U.S. PATENT DOCUMENTS

| | | | |
|---|---|---|---|
| 2,443,471 | 6/1948 | Mason | 310/326 |
| 3,245,012 | 4/1966 | Schöfer | 310/367 |
| 3,576,453 | 4/1971 | Mason | 310/320 |
| 3,676,724 | 7/1972 | Berlincourt et al. | 310/326 |
| 4,037,180 | 7/1977 | De Wild | 310/326 |
| 4,365,181 | 12/1982 | Yamamoto | 310/320 |
| 5,192,925 | 3/1993 | Kaida | 310/367 |
| 5,302,880 | 4/1994 | Kaida | 310/367 |

FOREIGN PATENT DOCUMENTS

| | | | |
|---|---|---|---|
| 0053689 | 4/1977 | Japan | 310/320 |
| 0053690 | 4/1977 | Japan | 310/320 |
| 0128813 | 7/1984 | Japan | 310/361 |
| 0642800 | 1/1979 | U.S.S.R. | 310/326 |

OTHER PUBLICATIONS

J. P. Den Hartog, "Mechanical Vibrations", pp. 87–93, Dover Publications, Inc. New York, 1985.

Osamu Taniguchi, "Vibration Technology", pp. 113–116, Corona Publishing Co., Ltd. with English language translation.

Primary Examiner—Thomas M. Dougherty
Attorney, Agent, or Firm—Ostrolenk, Faber, Gerb & Soffen

[57] ABSTRACT

Disclosed herein is an energy trap type piezo-resonator (11) utilizing a thickness shear vibration mode, which is prepared by forming electrodes (13, 14) on both major surfaces of a piezoelectric substrate (12) and providing dynamic damper parts (17, 18) being held between grooves (15a, 15b; 16a, 16b) for preventing leakage of vibration from a vibrating part opposing the electrodes (13, 14) to each other to end portions of the piezoelectric substrate.

10 Claims, 5 Drawing Sheets

PIEZOELECTRIC RESONANCE COMPONENT

BACKGROUND OF THE INVENTION

1. Field of the Invention

The present invention relates to an energy trap type piezoelectric resonance component which is applied to a piezo-resonator, a piezoelectric filter or the like, and more particularly, it relates to an energy trap type piezoelectric resonance component utilizing a shear vibration mode such as a thickness shear vibration mode or a width shear vibration mode.

2. Description of the Background Art

FIG. 2 is a perspective view showing an example of a conventional energy trap type piezo-resonator 1 utilizing a thickness shear vibration mode. This piezo-resonator 1 comprises an elongated rectangular piezoelectric substrate 2 and electrodes 3 and 4 which are formed on both major surfaces thereof. The piezoelectric substrate 2 is polarized along arrow P. The electrodes 3 and 4 are formed to be opposed to each other in a back-to-back manner through the piezoelectric substrate 2 on a central region thereof, so that vibration is excited by the portion opposing the electrodes 3 and 4 to each other. Further, the electrodes 3 and 4 are formed to reach different end portions of the piezoelectric substrate 2 respectively, so that the piezo-resonator 1 can be electrically connected with an external member and mechanically held on both ends of the piezoelectric substrate 2.

In the aforementioned energy trap type piezo-resonator 1, the as-excited vibration is trapped in the portion opposing the electrodes 3 and 4 to each other, i.e., in a vibrating part, so that the vibration is sufficiently damped around both ends of the piezoelectric substrate 2. Even if the piezo-resonator 1 is mechanically held at both ends of the piezoelectric substrate 2, therefore, its resonance characteristic is hardly deteriorated.

Such piezo-resonators 1 are generally mass-produced by forming mother electrodes on both major surfaces of a mother piezoelectric substrate and thereafter cutting the mother piezoelectric substrate along its thickness. In order to increase the number of such piezo-resonators 1 which can be obtained from the mother piezoelectric substrate for improving mass productivity, it is desirable to reduce the length L of each piezoelectric substrate 2. Further, miniaturization is required for the piezo-resonator 1 similarly to other electronic components, and hence it is desirable to reduce the length L of the piezoelectric substrate 2, in order to satisfy such a requirement.

When the length L of the piezoelectric substrate 2 is reduced, however, the vibration is insufficiently damped around both ends of the piezoelectric substrate 2. When both ends of the piezoelectric substrate 2 are mechanically held, therefore, the resonance characteristic is disadvantageously deteriorated. In particular, the resonance frequency of the piezo-resonator 1 is decided by the thickness of the piezoelectric substrate 2, while the length L of the piezoelectric substrate 2 must be increased in order to obtain a lower frequency by increasing the thickness of the piezoelectric substrate 2. If the length L of the piezoelectric substrate 2 is reduced in this case, it is extremely difficult to form a piezo-resonator having a sufficient resonance characteristic.

SUMMARY OF THE INVENTION

An object of the present invention is to provide an energy trap type piezoelectric resonance component utilizing a shear vibration mode, which can further effectively trap energy of a shear vibration mode in a vibrating part thereby further reducing the length of a piezoelectric substrate.

The present invention provides an energy trap type piezoelectric resonance component utilizing a shear vibration mode, which comprises a piezoelectric substrate having a pair of end portions and being polarized in a direction connecting the pair of end portions with each other, and a plurality of electrodes which are provided on an outer surface of the piezoelectric substrate to form at least one vibrating part by portions opposed to each other in a back-to-back manner. The vibrating part is provided between the pair of end portions of the piezoelectric substrate, and a dynamic damper part is provided in a piezoelectric substrate portion between the vibrating part and at least one end portion of the piezoelectric substrate.

The plurality of electrodes are provided on the piezoelectric substrate in various modes. For example, the plurality of electrodes may be prepared from first and second electrodes which are provided on both major surfaces of the piezoelectric substrate respectively, so that the first and second electrodes are opposed to each other in a back-to-back manner through the piezoelectric substrate. Alternatively, first and second electrodes may be formed on one major surface of the piezoelectric substrate through a region of a prescribed width, while a third electrode may be formed on another major surface of the piezoelectric substrate to overlap with the first and second electrodes, thereby forming the aforementioned vibrating part. Further, first and electrodes may be formed on one major surface of the piezoelectric substrate along a pair of side edges, so that the first and electrodes are opposed to each other on a central region for forming the aforementioned vibrating part.

On the other hand, the aforementioned dynamic damper part, which can be formed by various methods, may be formed by a piezoelectric substrate portion defined between two grooves which are worked in the piezoelectric substrate, for example.

The feature of the inventive piezoelectric resonance component resides in that energy trap efficiency is improved through a dynamic damper phenomenon. The dynamic damper phenomenon is described in "Vibration Technology" by Osamu Taniguchi, Corona Publishing Co., Ltd. JAPAN, pp. 113 to 116 in detail, for example. Briefly stated, this phenomenon can be expressed as a phenomenon of suppressing vibration of a main vibrator is by coupling a subvibrator to the main vibrator which must be prevented from vibration and properly selecting the characteristic frequency of the subvibrator.

In the piezoelectric resonance component according to the present invention, a dynamic damper part utilizing the aforementioned dynamic damper phenomenon is formed between the vibrating part and an end portion of the piezoelectric substrate. This dynamic damper part is provided for suppressing vibration of a piezoelectric substrate portion between the vibrating part and the dynamic damper part, i.e., a portion which vibrates by vibration leaking from the vibrating part, by the dynamic damper phenomenon.

The dynamic damper part is provided between the end portion of the piezoelectric substrate and the vibrating part as hereinabove described, whereby the vibration leaking from the vibrating part is suppressed by this dynamic damper part and hence it is possible to effectively prevent the vibration from transmission to the end portion of the piezoelectric substrate.

In the piezoelectric resonance component according to the present invention, the dynamic damper part is provided in at least one portion between the vibrating part and the end portion of the piezoelectric substrate to effectively suppress vibration which leaks to the piezoelectric substrate portion between the dynamic damper part and the vibrating part, whereby it is possible to reduce the distance between the dynamic damper part and the end portion of the piezoelectric substrate. Therefore, the resonance characteristic is hardly deteriorated even if the length of the piezoelectric substrate is reduced, since it is possible to reliably trap vibration energy in a portion reaching the dynamic damper part.

Thus, it is possible to provide a smaller piezoelectric resonance component as compared with a conventional piezoelectric resonance component utilizing a shear vibration mode without deteriorating its resonance characteristic.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described, to clarify the present invention.

Figure 1:
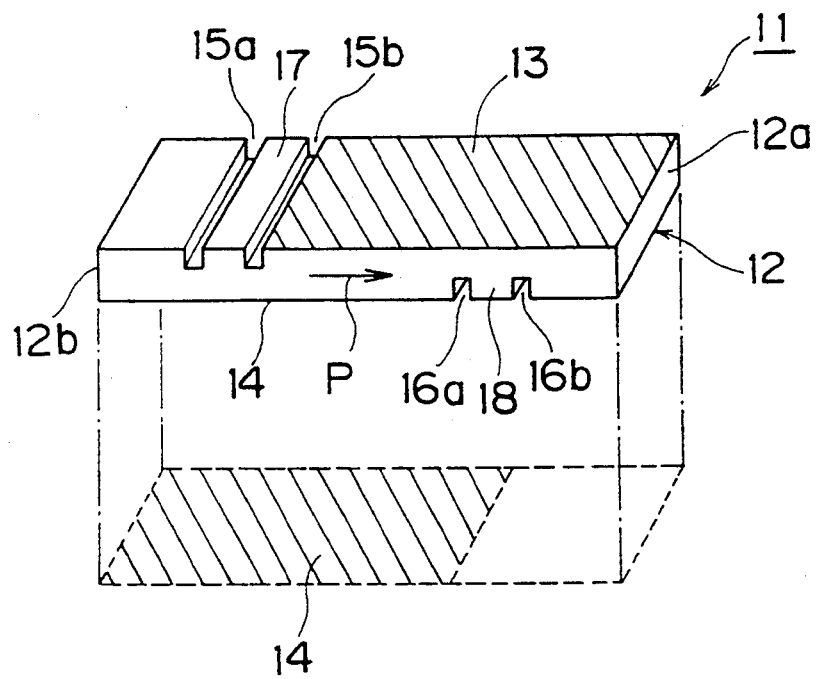
FIG. 1 is a perspective view showing a piezo-resonator according to a first embodiment of the present invention.

FIG. 1 is a perspective view showing an energy trap type piezo-resonator 11 utilizing a thickness shear vibration mode according to a first embodiment of the present invention.

The piezo-resonator 11 is formed by a piezoelectric substrate 12 having an elongated rectangular planar shape. The piezoelectric substrate 12, which is made of a piezoelectric material such as piezoelectric ceramics, for example, is polarized along arrow P, i.e., along its longitudinal direction.

An electrode 13 is formed on an upper surface of the piezoelectric substrate 12, to reach a central region from one end surface 12a. On the other hand, another electrode 14 is formed on a lower surface of the piezoelectric substrate 12 to reach the central region from another end surface 12b, as projected in a lower part of FIG. 1. These electrodes 13 and 14 are arranged to be opposed to each other in a back-to-back manner through the piezoelectric substrate 12 in the longitudinal central region of the piezoelectric substrate 12. When an alternating voltage is applied across the electrodes 13 and 14, therefore, thickness shear vibration is excited in the piezoelectric substrate portion opposing the electrodes 13 and 14 to each other. Thus, the piezoelectric substrate portion opposing the electrodes 13 and 14 to each other defines a vibrating part.

In the upper surface of the piezoelectric substrate 12, grooves 15a and 15b extending along its width are formed between the vibrating part and the end surface 12b. Also on the lower surface of the piezoelectric substrate 12, grooves 16a and 16b extending along its width are formed in a region between the electrode 14 and the end surface 12a.

In the piezo-resonator I1 according to this embodiment, dynamic damper parts 17 and 18 are defined between the grooves 15a and 15b as well as between the grooves 16a and 16b respectively. These dynamic damper parts 17 and 18 vibrate through vibration leaking from the vibrating part, to suppress the vibration by a dynamic damper phenomenon. Therefore, the shapes of the dynamic damper parts 17 and 18 are preferably so determined that resonance frequencies of these dynamic damper parts 17 and 18 are equal to that of the vibration propagated from the vibrating part.

In the piezo-resonator 11 according to this embodiment, vibration which is not trapped in the vibrating part, i.e., vibration components leaking from the vibrating part toward the end surfaces 12a and 12b are sufficiently damped by the dynamic damper parts 17 and 18. Thus, vibration energy is reliably trapped in the regions provided with the dynamic damper parts 17 and 18. Even if the length of the piezoelectric substrate 12 is reduced, therefore, it is possible to mechanically hold portions of the piezoelectric substrate 12 close to longitudinal end portions with no deterioration in its resonance characteristic, since substantially no vibration is transmitted to portions of the piezoelectric substrate 12 which are located outwardly beyond the dynamic damper parts 17 and 18.

Figure 2:
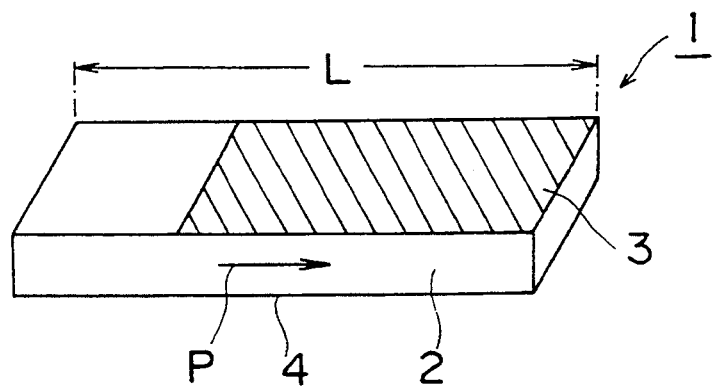
FIG. 2 is a perspective view showing a conventional energy trap type piezo-resonator.
Figure 3A:
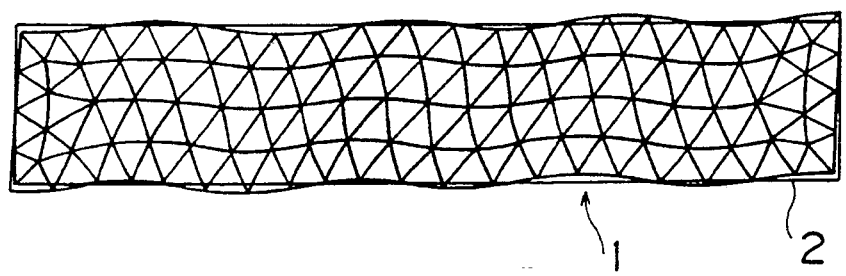
FIGS. 3A and 3B are diagrams obtained by analyzing vibration modes of conventional piezo-resonators utilizing thickness shear vibration modes by a finite element method respectively.
Figure 3B:
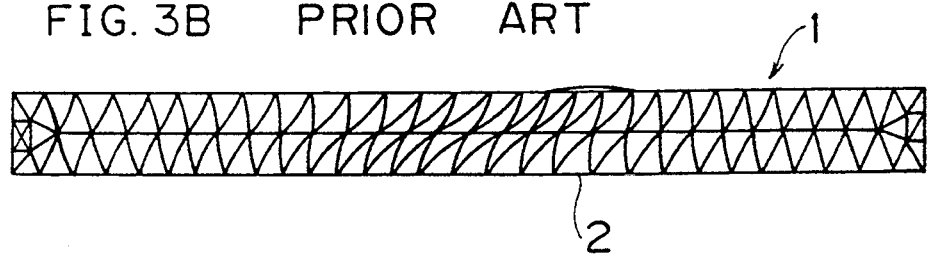

The fact that the end portions of the piezoelectric substrate 12 hardly vibrate due to provision of the dynamic damper parts 17 and 18 is now illustrated with reference to vibration modes analyzed by a finite element method. FIGS. 3A and 3B are diagrams obtained by analyzing vibration modes in samples of the conventional piezo-resonator 1 (see FIG. 2) on the basis of the finite element method. It is understood from FIG. 3A that vibration components are transmitted to end portions of a piezoelectric substrate 2 in a conventional piezo-resonator 1, to extremely displace the end portions of the piezoelectric substrate 2. When the length of a piezoelectric substrate 2 is considerably increased with respect to the thickness in a piezo-resonator 1 as shown in FIG. 3B, on the other hand, displacement in the vicinity of each end portion of the piezoelectric substrate 2 is considerably reduced. When the piezoelectric substrate 2 is thus lengthened, however, the size of the piezo-resonator 1 is disadvantageously increased.

Figure 4:
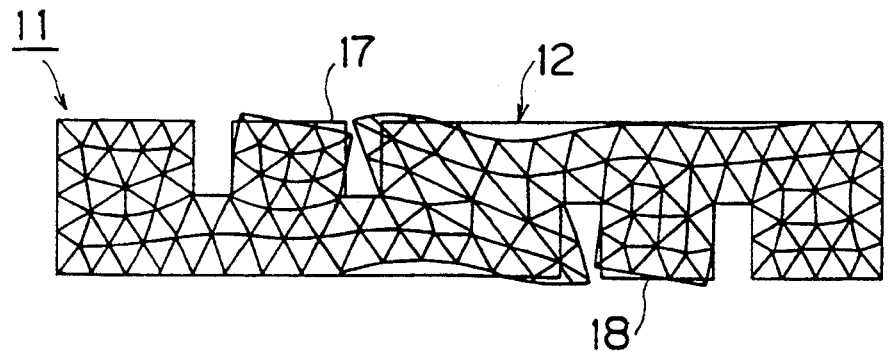
FIG. 4 expresses a vibration mode of the piezo-resonator according to the first embodiment of the present invention by analyzing the same by a finite element method.

In the piezo-resonator 11 according to the first embodiment, on the other hand, it is understood that the piezoelectric substrate portions located outwardly beyond the dynamic damper parts 17 and 18 are hardly displaced, due to actions of the dynamic damper parts 17 and 18, as shown in FIG. 4.

Figure 5:
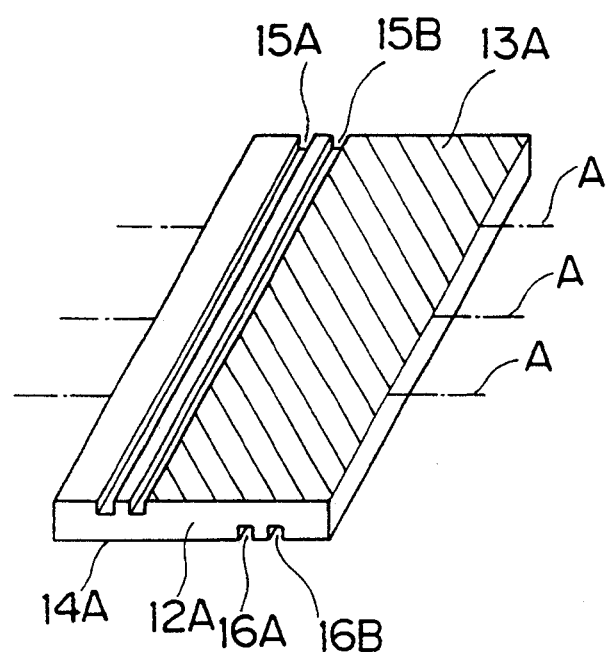
FIG. 5 is a perspective view for illustrating a step of manufacturing the piezo-resonator according to the first embodiment of the present invention from a mother piezoelectric substrate.

The aforementioned dynamic damper parts 17 and 18 can be formed through steps substantially similar to those in a method of manufacturing the conventional piezo-resonator 1. For example, a mother piezoelectric substrate 12A is prepared similarly to the conventional method, with mother electrodes 15A and 14A which are formed on both major surfaces thereof as shown in FIG. 5, for example. Thereafter grooves 15A, 15B, 16A and 16B are formed on both major surfaces of the mother piezoelectric substrate 12A, so that the piezo-resonator 11 shown in FIG. 1 can be easily obtained by cutting the mother piezoelectric substrate 12 along one-dot chain lines A shown in FIG. 5. Namely, this method includes only an additional step of forming the grooves 15A to 16B in the mother piezoelectric substrate 12A.

While the mother electrodes 13A and 14A are formed only on portions of both major surfaces for defining electrodes in the example shown in FIG. 5, the aforementioned grooves 15A to 16B may alternatively be formed after electrodes are provided entirely over both major surfaces of the mother piezoelectric substrate 12A so that not only the mother electrodes 13A and 14A for defining the electrodes but terminal electrodes for finally electrically connecting the piezo-resonator to an external member can be simultaneously formed in portions of the piezoelectric substrate located outwardly beyond the dynamic damper parts 17 and 18.

Figure 6A:
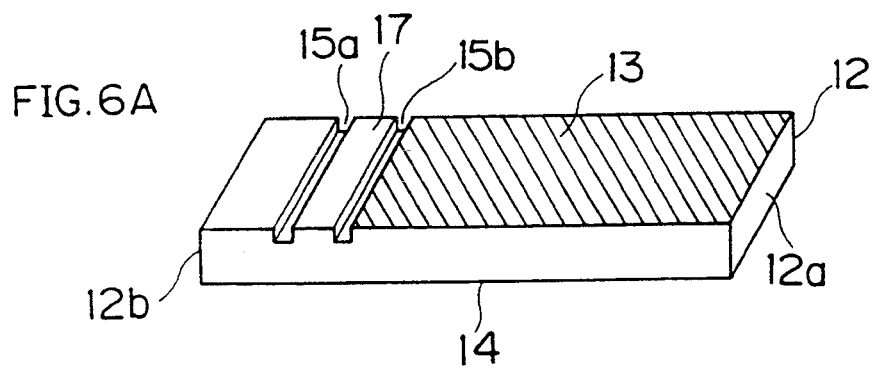
FIGS. 6A to 6C are perspective views for illustrating modifications of the piezo-resonator according to the first embodiment of the present invention respectively.

While the dynamic damper parts 17 and 18 are formed on both sides of the vibrating part in the piezoelectric substrate 12 respectively in the first embodiment, a dynamic damper part 17 may be formed only on an upper surface of a piezoelectric substrate 12 with no provision of such a dynamic damper part on a lower surface, as shown in FIG. 6A. Thus, the dynamic damper part may be formed only on one side of the vibrating part, and also in this case, it is possible to further effectively trap vibration energy as compared with the conventional piezo-resonator 1. In the structure provided with the dynamic damper part 17 only on one side as shown in FIG. 6A, further, it is possible to simplify the working step as compared with the piezo-resonator 11 according to the first embodiment, since grooves 15a and 15b may be formed only on one side of the piezoelectric substrate 12.

Figure 6B:
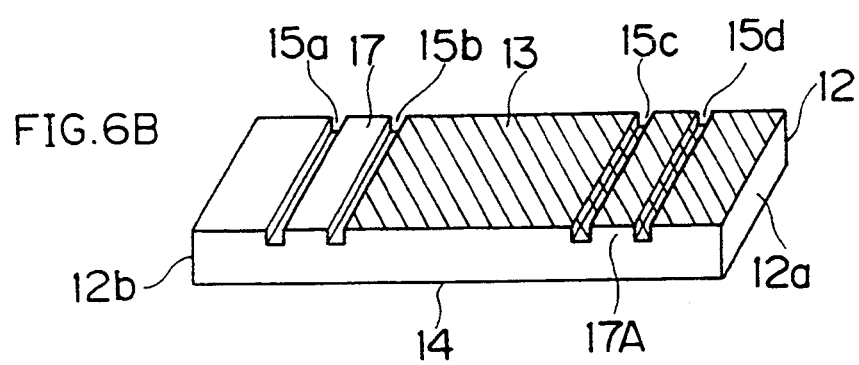

Alternatively, additional grooves 15c and 15d may be formed on an upper surface of a piezoelectric substrate 12 in positions close to an end surface 12a in parallel with each other at a prescribed distance thereby forming an additional vibration absorbing part 17A, as shown in FIG. 6B. In this case, the dynamic damper part 17A is formed in addition to the aforementioned dynamic damper part 17 on the upper surface of the piezoelectric substrate 12, whereby it is possible to further reliably trap vibration energy in the vibrating part as compared with the piezo-resonator shown in FIG. 6A.

Figure 6C:
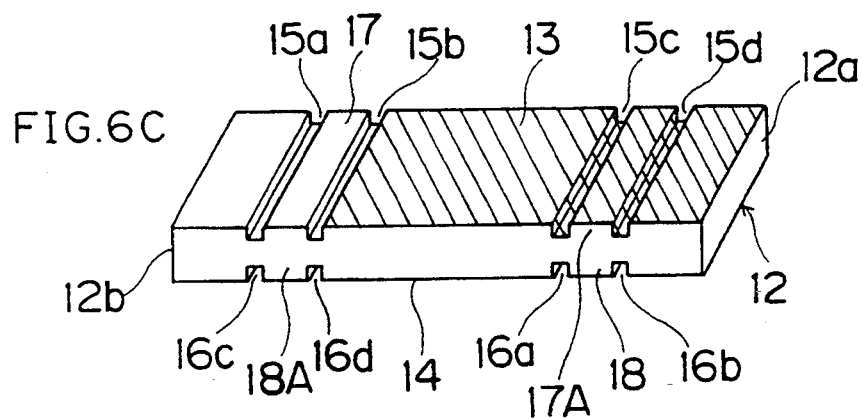

Further, grooves 15a to 15d and 16a to 16d may be formed on both of upper and lower surfaces of a piezoelectric substrate 12 as shown in FIG. 6C, to define plural dynamic damper parts 17, 17A, 18 and 18A respectively.

As clearly understood from FIGS. 6A to 6C, the dynamic damper parts according to the present invention may be provided in portions provided with electrodes such as electrodes. When the dynamic damper parts are provided in such portions provided with electrodes, however, it is necessary to reliably form electrode films also in the grooves, as shown in the figures.

While the dynamic damper parts 17 and 18A provided on the upper and lower surfaces respectively are formed on positions to be opposed to each other in a back-to-back manner through the piezoelectric substrate 12 in FIG. 6C, such dynamic damper parts 17 and 18A may alternatively be formed on different positions along the longitudinal direction of the piezoelectric substrate 12. Similarly, the dynamic damper parts 17A and 18 may also be formed on different positions along the longitudinal direction of the piezoelectric substrate 12.

Figure 7:
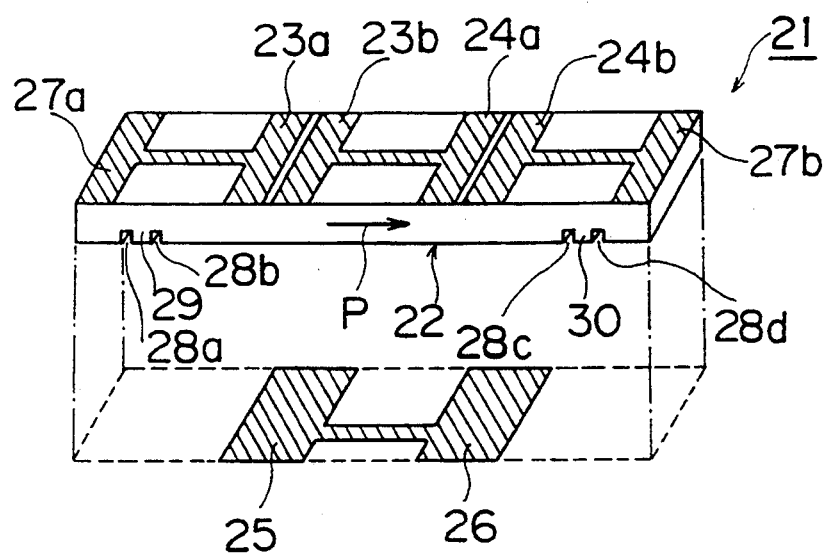
FIG. 7 is a perspective view showing a double-mode piezoelectric filter according to a second embodiment of the present invention.

FIG. 7 is a perspective view showing a double-mode piezoelectric filter 21 utilizing a thickness shear vibration mode, as a piezoelectric resonance component according to a second embodiment of the present invention. This energy trap type double-mode piezoelectric filter 21 is formed by an elongated rectangular piezoelectric substrate 22. The piezoelectric substrate 22, which is made of a piezoelectric material such as piezoelectric ceramics, for example, is polarized along arrow P. Electrodes 23a and 23b are formed on an upper surface of the piezoelectric substrate 22, to be opposed to each other through a region of a prescribed width. Similarly, other electrodes 24a and 24b are formed on the upper surface of the piezoelectric substrate 22 to be opposed to each other through a region of a prescribed width in portions separated from the electrodes 23a and 23b.

On a lower surface of the piezoelectric substrate 22, on the other hand, an electrode 25 is formed to be opposed to the electrodes 23a and 23b in a back-to-back manner, while another electrode 26 is formed to be opposed to the electrodes 24a and 24b in a back-to-back manner.

On the upper surface of the piezoelectric substrate 22, a terminal electrode 27a which is provided on an end portion is electrically connected with the electrode 23b by a connecting conductive part, while the electrode 24b is electrically connected with another terminal electrode 27b by a connecting conductive part. Further, the electrodes 23b and 24a are electrically connected with each other by a connecting conductive part, while the electrodes 25 and 26 are similarly electrically connected with each other by a connecting conductive part on the lower surface of the piezoelectric substrate 22.

According to this embodiment, a first resonance part is formed in the portion provided with the electrodes 23a, 23b and 25 and a second resonance part is formed in the portion provided with the electrodes 24a, 24b and 26 while an input/output end is defined between the terminal electrodes 27a and 27b, to form a three-terminal type double-mode piezoelectric filter whose electrodes 25 and 26 are connected to a reference potential.

According to this embodiment, grooves 28a to 28d are formed on the lower surface of the piezoelectric substrate 22 to extend along its width, thereby defining dynamic damper parts 29 and 30 between the first and second resonance parts and the end portions of the piezoelectric substrate 22 respectively.

Sizes of the dynamic damper parts 29 and 30 are so determined as to sufficiently damp vibration components which are propagated from the resonance parts. Also according to this embodiment, therefore, it is possible to substantially reliably prevent leakage of vibration components to end portions of the piezoelectric substrate 22, due to actions of the dynamic damper parts 29 and 30. Thus, it is possible to reduce the length of the piezoelectric substrate 22 with no deterioration in its resonance characteristic, similarly to the first embodiment.

Figure 8:
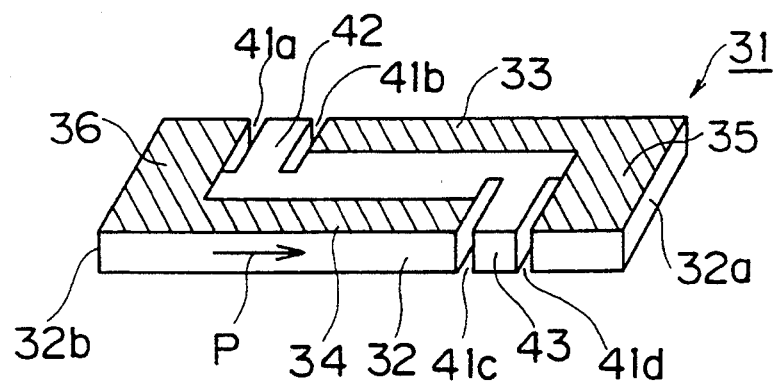
FIG. 8 is a perspective view showing a piezo-resonator utilizing a width shear vibration mode according to a third embodiment of the present invention.

FIG. 8 is a perspective view showing a piezo-resonator 31 according to a third embodiment of the present invention.

This piezo-resonator 31 is an energy trap type piezoresonator utilizing a width shear vibration mode. An elongated rectangular piezoelectric substrate 32 is polarized along arrow P, i.e., along its longitudinal direction. The piezoelectric substrate 32 is provided on its upper surface with electrodes 33 and 34 extending along respective side edges from end surfaces 32a and 32b respectively. On the upper surface of the piezoelectric substrate 32, the electrodes 33 and 34 are formed to be opposed to each other on a central region, so that a piezoelectric substrate portion in the region opposing the electrodes 33 and 34 to each other forms a vibrating part. Further, terminal electrodes 35 and 36 having relatively wide areas are formed on outer ends of the electrodes 33 and 34, i.e., portions reaching the end surfaces 32a and 32b.

In this embodiment, an alternating voltage is applied across the electrodes 33 and 34, so that vibration energy of a width shear vibration mode is trapped in the vibration part and a resonance characteristic based on the as-trapped vibration energy can be extracted.

Also in this embodiment, dynamic damper parts 42 and 43 are formed between the vibration part and the end portions of the piezoelectric substrate 32. Namely, grooves 41a to 41d are formed from side surfaces of the piezoelectric substrate 32 toward the inner side as shown in FIG. 8, to define the dynamic damper parts 42 and 43. The dynamic damper parts 42 and 43, which are adapted to damp vibration components transmitted from the vibrating part toward the end portions of the piezoelectric substrate 32 by the dynamic damper phenomenon, are formed to have sizes sufficient for damping such vibration components.

Also in the third embodiment, transmission of vibration components to the end portions of the piezoelectric substrate 32 is prevented by actions of the dynamic damper parts 42 and 43, whereby the resonance characteristic is hardly deteriorated even if the length of the piezoelectric substrate 32 is reduced.

While a single dynamic damper part is formed between the vibrating part and a single end surface of the piezoelectric substrate in each of the aforementioned embodiments except the piezo-resonator shown in FIG. 6C, a plurality of such dynamic damper parts may be formed between the vibrating part and a single end surface of the piezoelectric substrate. In this case, the dynamic damper parts may be separated onto the upper and lower surfaces of the piezoelectric substrate as shown in FIG. 6C, or a plurality of such dynamic damper parts may be formed on either the upper or lower surface of the piezoelectric substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An energy trap type piezoelectric resonance component utilizing a shear vibration mode, comprising:
   a piezoelectric substrate having a pair of end portions and being polarized in a direction connecting said pair of end portions with each other; and
   a plurality of electrodes provided on at least one outer surface of said piezoelectric substrate, said plurality of electrodes having respective portions thereof that are opposed to each other for defining at least one vibrating part of said piezoelectric substrate, a vibration having a corresponding frequency being transmitted from said vibrating part upon vibration of said vibrating part,
   said vibrating part being disposed between said pair of end portions of said piezoelectric substrate,
   a portion of said piezoelectric substrate between said vibrating part and at least one of said end portions of said piezoelectric substrate comprising a dynamic damper part,
   the dynamic damper part being structured and arranged on said piezoelectric substrate such that a resonance frequency of said dynamic damper part is substantially equal to the frequency of vibration transmitted from said vibrating part.

2. A piezoelectric resonance component in accordance with claim 1, wherein said plurality of electrodes are first and second electrodes provided on both major surfaces of said piezoelectric substrate respectively, said first and second electrodes being opposed to each other in a back-to-back manner through said piezoelectric substrate.

3. A piezoelectric resonance component in accordance with claim 2, wherein said dynamic damper part is a piezoelectric substrate portion that is defined between two grooves by working said grooves in said piezoelectric substrate.

4. A piezoelectric resonance component in accordance with claim 3, wherein said dynamic damper part is provided on each major surface of said piezoelectric substrate.

5. A piezoelectric resonance component in accordance with claim 3, wherein said dynamic damper part is provided on one major surface of said piezoelectric substrate.

6. A piezoelectric resonance component in accordance with claim 1, wherein a plurality of said vibrating parts are provided to form an energy trap type double-mode piezoelectric filter by said plurality of vibrating parts.

7. A piezoelectric resonance component in accordance with claim 6, wherein each said vibrating part is formed by first and second electrodes provided on one major surface of said piezoelectric substrate through a region of a prescribed width and a third electrode provided on another major surface of said piezoelectric substrate to overlap with said first and second electrodes through said piezoelectric substrate.

8. A piezoelectric resonance component utilizing a width shear vibration mode in accordance with claim 1, wherein said piezoelectric substrate is a rectangular piezoelectric substrate polarized along its longitudinal direction, first and second electrodes located on one major surface of said piezoelectric substrate to extend along a pair of side edges, said first and second electrodes being opposed on a central region for forming said vibrating part.

9. An energy trap type piezoelectric resonance component utilizing a shear vibration mode, comprising:

a piezoelectric substrate having a pair of end portions and being polarized in a direction connecting said pair of end portions with each other; and a plurality of electrodes provided on at least one outer surface of said piezoelectric substrate, said plurality of electrodes having respective portions thereof that are opposed to each other for defining a plurality of vibrating parts, said plurality of vibrating parts forming an energy trap type double-mode piezoelectric filter, said vibrating parts being disposed between said pair of end portions of said piezoelectric substrate, a portion of said piezoelectric substrate between said vibrating part and at least one of said end portions of said piezoelectric substrate being located between two grooves provided in said piezoelectric substrate, said portion of said piezoelectric substrate being structured and arranged for damping vibration transmitted from said vibrating parts.

10. A piezoelectric resonance component utilizing a width shear vibration mode, comprising:

a rectangular piezoelectric substrate having a pair of end portions and being polarized along a longitudinal direction thereof connecting said pair of end portions with each other; and a first and a second electrode provided on one major surface of said piezoelectric substrate to extend along a pair of side edges thereof, said first and second electrodes having respective portions that are opposed to each other on a central region of said piezoelectric substrate for defining at least one vibrating part, said vibrating part being disposed between said pair of end portions of said piezoelectric substrate, a portion of said piezoelectric substrate between said vibrating part and at least one of said end portions of said piezoelectric substrate being located between two grooves provided in said piezoelectric substrate, said portion of said piezoelectric substrate being structured and arranged for damping vibration transmitted from said vibrating part.

* * * * *